United States Patent
Nakahata et al.

[11] Patent Number: 5,814,918
[45] Date of Patent: Sep. 29, 1998

[54] DIAMOND-ZNO SURFACE ACOUSTIC WAVE DEVICE

[75] Inventors: Hideaki Nakahata; Kenjiro Higaki; Satoshi Fujii; Hiroyuki Kitabayashi; Shinichi Shikata, all of Itami, Japan

[73] Assignee: Sumitomo Electric Industries, Ltd., Japan

[21] Appl. No.: 689,296

[22] Filed: Aug. 7, 1996

[30] Foreign Application Priority Data

Aug. 8, 1995 [JP] Japan .................................. 7-202114

[51] Int. Cl.⁶ .......................... H03H 9/145; H01L 41/08
[52] U.S. Cl. ................................ 310/313 R; 310/313 A
[58] Field of Search ........................... 310/313 R, 313 A

[56] References Cited

U.S. PATENT DOCUMENTS

| | | | |
|---|---|---|---|
| 5,426,340 | 6/1995 | Nakahata et al. | 310/313 R |
| 5,446,329 | 8/1995 | Nakahata et al. | 310/313 A |
| 5,565,725 | 10/1996 | Nakahata et al. | 310/313 A |
| 5,646,468 | 7/1997 | Nakahata et al. | 310/313 A |

FOREIGN PATENT DOCUMENTS

| | | | |
|---|---|---|---|
| A-0 588 261 | 3/1994 | European Pat. Off. | H03H 9/02 |
| A-0 608 864 | 8/1994 | European Pat. Off. | H03H 9/02 |
| 0 758 165 A1 | 2/1997 | European Pat. Off. | H03H 9/02 |
| 0 766 383 A2 | 4/1997 | European Pat. Off. | H03H 9/02 |
| 3-198412 | 8/1991 | Japan | H03H 9/145 |
| 8-32398 | 2/1996 | Japan | H03H 9/145 |
| 8-65088 | 3/1996 | Japan | H03H 9/145 |

OTHER PUBLICATIONS

Mitsuyu et al., "Structures and SAW Properties of rf-sputtered single-crystalline films of ZnO on sapphire", J. Appl. Phys. 51(5): 2464–2470 (May 1980).

*Primary Examiner*—Thomas M. Dougherty
*Attorney, Agent, or Firm*—Pennie & Edmonds LLP

[57] ABSTRACT

The present invention directed to a SAW device comprising a diamond layer a ZnO layer and an $SiO_2$ layer, which can be operated at the frequency of 2 GHz or higher, with superior durability and less energy loss. The SAW device for 2nd mode surface acoustic wave of a wavelength $\lambda$ ($\mu$m) according to the present invention comprises: (i) a diamond layer, (ii) a ZnO layer formed on the diamond layer, the ZnO layer having a thickness $t_z$, (iii) an interdigital transducer (IDT) formed over the ZnO layer, and (iv) a $SiO_2$ layer formed over the interdigital transducer onto the ZnO layer, the $SiO_2$ layer having a thickness of $t_s$; wherein parameters $kh_z=(2\pi/\lambda)t_z$ and $kh_s=(2\pi/\lambda)t_s$ are given within a region A-B-C-D-E-F-G-H-I-J-K-L-M-N-O-P-Q-R-A in a two-dimensional Cartesian coordinate graph having abscissa axis of $kh_z$ and ordinate axis of $kh_s$, the outer edge of the region A-B-C-D-E-F-G-H-I-J-K-L-M-N-O-P-Q-R-A being given by a closed chain in the Cartesian coordinate, consisting of points A, B, C, D, E, F, G, H, I, J, K, L, M, N, O, P, Q and R and lines A-B, B-C, C-D, D-E, E-F, F-G, G-H, H-I, I-J, J-K, K-L, L-M, M-N, N-O, O-P, P-Q, Q-R and R-A, as shown in FIG. 1.

10 Claims, 12 Drawing Sheets

TYPE A

TYPE B

TYPE C

TYPE D

TYPE E

TYPE F

TYPE G

DIAMOND-ZNO SURFACE ACOUSTIC WAVE DEVICE

BACKGROUND OF THE INVENTION

1. Field of the Invention

The present invention relates to an improved surface acoustic wave (SAW) device which comprises ZnO and diamond. The SAW device according to the present invention is applicable in operating at higher frequency.

2. Related Background Art

A surface acoustic wave device (SAW device) is a device which utilizes the acoustic wave propagation and the piezoelectricity on the surface of particular solid materials. The SAW device has excellent temperature stability, durability, and phase characteristics. Thus, there are certain demands, in the field of the advanced communication technology, for SAW devices which can be used in high frequency bands of more than 2 GHz, such as band-stop filters, resonators, delay devices, signal processing devices, convolvers, and functional elements for opto-electronic devices. For example, the band-stop filter with wider bandwidth is necessary for the equipments for cellular phones/communications which are typically operated in high frequency bands of more than 2 GHz.

The SAW devices typically comprises interdigital transducers(IDT) for generating and detecting the surface acoustic wave. The operation frequency(f) of a SAW device is given by the equation: $f=V/\lambda$, where V is the wave propagation velocity in the SAW device, and $\lambda$ is the wavelength of the surface acoustic wave. The operation frequency of more than 2 GHz is required for SAW device to be used for the band-stop filters with wider bandwidth. The wavelength $\lambda$ is generally proportional to the width (d) of electrodes of the interdigital transducer.

Because of difficulties on microfabrication technique, the electrode with the width (d) of less than 0.5 $\mu$m is difficult to be obtained, thus it is difficult to achieve desirable operation frequency (f) of more than 2 GHz by decreasing wavelength $\lambda$. Therefore, the SAW device with higher propagation velocity V is required for being applied to the operation at the frequency of 2 GHz or higher.

The energy transform (piezoelectric) efficiency is also important for SAW device to be used for the advanced communication equipments. The effective coupling coefficient($K^2$) is an index to conversion efficiency of the converting of electrical energy into mechanical energy on the surface of the device. The preferable range of the effective coupling coefficient depends upon applications; about 0.15%–about 0.7% for narrow-band filter; about 0.7%–about 3% for medium-band filter; and about 3%–about 6% for wide-band filter.

The temperature coefficient for frequency (TCF) of the SAW device is preferable to be small as possible, because the smaller temperature dependency of the SAW device is desirable. The propagation loss of the SAW device is also preferable to be small as possible, since smaller attenuation in propagation of surface acoustic wave is desirable.

The theoretical and the experimental evaluation on surface acoustic wave properties of SAW devices, which includes ZnO for piezoelectric material and sapphire, is disclosed by Mitsuyu et.al.(Mitsuyu,T., S Ono and K Wasa, J. Appl. Phys, 2464–2470,51(5), May 1980). The reference teaches that the sapphire-ZnO SAW device can be used for filter with 1050 MHz center frequency. However, Mitsuyu did not teach the SAW device which can be operated at the frequency of 3 MHz or higher. Consequently, a different constitution of SAW device is necessary for the operation at higher frequency.

Diamond is a material which have higher sonic propagation properties than other materials for SAW device, such as sapphire.

FIGS. 2A to 2G illustrate the layer/electrode constitution of SAW devices. In U.S. Pat. No. 5,446,329 to Nakahata et.al., propagation velocity V, effective coupling coefficient $K^2$ and temperature coefficient with frequency TCF have been improved, in particular by focusing first mode surface acoustic wave: for example, V of 8,000 to 10,000 (m/s), TCF of −10 to 10 (ppm/°C.) and $K^2$ of 0.7 to 1.7 (%) are achieved for "type E" constitution shown in FIG. 2E; V of 8,000 to 10,000 (m/s), TCF of −10 to 10 (ppm/°C.) and $K^2$ of 1 to 3 (%) are achieved for "type B" constitution shown in FIG. 2B; V of 8,000 to 10,000 (m/s), TCF of −10 to 10 (ppm/°C.) and $K^2$ of 1.5 to 4.5 (%) are achieved for "type F" constitution shown in FIG. 2F; V of 8,000 to 10,000 (m/s), TCF of −10 to 10 (ppm/°C.) and $K^2$ of 0.8 to 2.3 (%) are achieved for "type D" constitution shown in FIG. 2D; and V of 8,000 to 10,000 (m/s), TCF of −10 to 10 (ppm/°C.) and $K^2$ of 0.7 to 2.2 (%) are achieved for "type G" constitution shown in FIG. 2G.

It is also known that the performances of the SAW device can be further improved by employing $LiNbO_3$ or $LiTaO_3$ for piezoelectric material of SAW device.

Nevertheless, the use of ZnO for piezoelectric material of SAW device can provide significant advantage in fabricating SAW device, because film formability of ZnO film onto diamond layer is much better than $LiNbO_3$ or $LiTaO_3$ films. Therefore, it is desirable to further improve the performances of SAW device which comprise ZnO piezoelectric layer.

It is also desirable to further improve the performances of the SAW devices in which short circuit electrode, typically made of aluminum (Al), is not included between diamond layer and ZnO layer, such as "type A" and "type C" devices shown in FIG. 2A and FIG. 2C, respectively. Because such device constitution can eliminate the limitation on the process conditions for forming ZnO layer such as process temperature, since Al electrode having relatively low melting point is not included.

Therefore, it is an object of the invention to further improve the propagation velocity V, the effective coupling coefficient $K^2$, the thermal coefficient for frequency TCF and propagation loss of the SAW device which includes ZnO piezoelectric layer formed on diamond layer, to provide SAW device having improved operation characteristics at the frequency of 2 GHz or higher with superior durability and less energy loss.

SUMMARY OF THE INVENTION

We have evaluated a number of experimental results to obtain the desirable range of layer thickness which provides desired operation frequency with less energy loss, by using a dimensionless thickness $kh_1$, which is defined as $kh_z=2\pi(t_z/\lambda)$, where $t_z$ ($\mu$m) is the thickness of the piezoelectric material (ZnO) layer and $\lambda$ is the wavelength of the surface acoustic wave. This parameter is appropriate in the present invention for determining the desirable thickness with the specified wavelength propagating across the surface of SAW device.

We have also evaluated a number of experimental results to obtain the desirable range of the passivating material ($SiO_2$) layer thickness which provides desired operation frequency with less energy loss, by using a dimensionless thickness $kh_s$, which is defined as $kh_s=2\pi(t_s/\lambda)$, where $t_s$ (μm) is the thickness of the $SiO_2$ layer and λ is the wavelength of the surface acoustic wave. After the evaluation, we have obtained satisfactory result in the SAW devices having layer/electrode constitutions shown in FIGS. 2A (type A), 2B (type B), 2C (type C), 2D (type D) and 2F (type F).

The SAW devices according to the present invention are provide with superior operating performances such as propagation velocity (V), temperature coefficient for frequency (TCF), effective coupling coefficient ($K^2$) and propagation loss. Such performances have not been experienced for SAW devices having the layer/electrode constitutions shown in FIGS. 2A, 2B, 2C, 2D and 2F.

The first SAW device for 2nd mode surface acoustic wave of a wavelength λ (μm) according to the present invention comprises: (i) a diamond layer, (ii) a ZnO layer formed on the diamond layer, the ZnO layer having a thickness $t_z$, (iii) an interdigital transducer (IDT) formed over the ZnO layer, and (iv) a $SiO_2$ layer formed over the interdigital transducer onto the ZnO layer, the $SiO_2$ layer having a thickness of $t_s$; wherein a parameter $kh_z=(2\pi/\lambda)t_z$ and a parameter $kh_s=(2\pi/\lambda)t_s$ are given within a region A-B-C-D-E-F-G-H-I-J-K-L-M-N-O-P-Q-R-A in a two-dimensional Cartesian coordinate graph having abscissa axis of $kh_z$ and ordinate axis of $kh_s$, the outer edge of the region A-B-C-D-E-F-G-H-I-J-K-L-M-N-O-P-Q-R-A being given by a closed chain in the Cartesian coordinate, consisting of points A, B, C, D, E, F, G, H, I, J, K, L, M, N, O, P, Q and R and lines A-B, B-C, C-D, D-E, E-F, F-G, G-H, H-I, I-J, J-K, K-L, L-M, M-N, N-O, O-P, P-Q, Q-R and R-A, the point A being given by a coordinate point ($kh_z=0.4$, $kh_s=0.55$); the point B being given by a coordinate point ($kh_z=0.6$, $kh_s=0.6$); the point C being given by a coordinate point ($kh_z=0.75$, $kh_s=0.63$); the point D being given by a coordinate point ($kh_z=0.88$, $kh_s=0.68$); the point E being given by a coordinate point ($kh_z=1.1$, $kh_s=0.8$); the point F being given by a coordinate point ($kh_z=1.3$, $kh_s=0.93$); the point G being given by a coordinate point ($kh_z=1.47$, $kh_s=1.03$); the point H being given by a coordinate point ($kh_z=1.61$, $kh_s=0.92$); the point I being given by a coordinate point ($kh_z=1.75$, $kh_s=0.77$); the point J being given by a coordinate point ($kh_z=1.82$, $kh_s=0.64$); the point K being given by a coordinate point ($kh_z=1.6$, $kh_s=0.54$); the point L being given by a coordinate point ($kh_z=1.41$, $kh_s=0.42$); the point M being given by a coordinate point ($kh_z=1.19$, $kh_s=0.35$); the point N being given by a coordinate point ($kh_z=1.03$, $kh_s=0.32$); the point O being given by a coordinate point ($kh_z=0.92$, $kh_s=0.28$); the point P being given by a coordinate point ($kh_z=0.8$, $kh_s=0.2$); the point Q being given by a coordinate point ($kh_z=0.66$, $kh_s=0.3$); and the point R being given by a coordinate point ($kh_z=0.53$, $kh_s=0.42$). The layer structure of this SAW device is schematically illustrated in FIG. 2A, "type A".

The SAW device having above constitution is provided with propagation velocity V of from 8,000 to 12,000 (m/s), temperature coefficient for frequency TCF of from −15 to 15 (ppm/°C.) and effective coupling coefficient $K^2$ of from 0.4 to 1.3 (%). The SAW device is also provided with propagation loss of 0.05 (dB/λ) for 1st mode SAW, and 0.03 (dB/λ) for 2nd mode SAW. Further, such constitution has an advantage in fabricating process.

The first surface acoustic wave device according to the invention may have another constitution in which the parameter $kh_z$ and $kh_s$ are given within a region A-B-C-D-S-T-M-N-O-P-Q-R-A in the two-dimensional Cartesian coordinate graph, the outer edge of the region A-B-C-D-S-T-M-N-O-P-Q-R-A being given by a closed chain in the Cartesian coordinate, consisting of the points A, B, C and D, a point S, a point T, the points M, N, O, P, Q and R and lines A-B, B-C, C-D, D-S, S-T, T-M, M-N, N-O, O-P, P-Q, Q-R and R-A, the point S being given by a coordinate point ($kh_z=0.98$, $kh_s=0.6$); and the point T being given by a coordinate point ($kh_z=1.1$, $kh_s=0.5$).

The SAW device having this constitution is provided with propagation velocity V of from 10,000 to 12,000 (m/s), temperature coefficient for frequency TCF of from −15 to 15 (ppm/°C.) and effective coupling coefficient $K^2$ of from 0.4 to 1.3 (%). The SAW device is also provided with propagation loss of 0.05 (dB/λ) for 1st mode SAW, and 0.03 (dB/λ) for 2nd mode SAW.

The two-dimensional Cartesian coordinate graph having abscissa axis of $kh_z$ and ordinate axis of $kh_s$ is shown in FIG. 1. The region A-B-C-D-E-F-G-H-I-J-K-L-M-N-O-P-Q-R-A and the region A-B-C-D-S-T-M-N-O-P-Q-R-A are also shown in FIG. 1.

The first SAW device having "type A" layer/electrode constitution has very simple constitution as shown in FIG. 2A, the production process of which is also simple. Thus, the "type A" SAW device according to the present invention can provide improved device performances to such simple device constitution.

The second SAW device for 2nd mode surface acoustic wave of a wavelength λ (μm) according to the present invention comprises: (i) a diamond layer, (ii) a short circuit electrode formed on the diamond layer, (iii) a ZnO layer formed over the short circuit electrode onto the diamond layer, the ZnO layer having a thickness $t_z$, (iv) an interdigital transducer (IDT) formed on the ZnO layer, and (v) a $SiO_2$ layer formed over the interdigital transducer onto the ZnO layer, the $SiO_2$ layer having a thickness of $t_s$; wherein a parameter $kh_z=(2\pi/\lambda)t_z$ and a parameter $kh_s=(2\pi/\lambda)t_s$ are given within a region A-B-C-D-E-F-G-H-I-J-K-L-M-N-O-P-Q-R-A in a two-dimensional Cartesian coordinate graph having abscissa axis of $kh_z$ and ordinate axis of $kh_s$, the outer edge of the region A-B-C-D-E-F-G-H-I-J-K-L-M-N-O-P-Q-R-A being given by a closed chain in the Cartesian coordinate, consisting of points A, B, C, D, E, F, G, H, I, J, K, L, M, N, O, P, Q and R and lines A-B, B-C, C-D, D-E, E-F, F-G, G-H, H-I, I-J, J-K, K-L, L-M, M-N, N-O, O-P, P-Q, Q-R and R-A. The layer structure of this SAW device is schematically illustrated in FIG. 2B, "type B".

The SAW device having above constitution is provided with propagation velocity V of from 8,000 to 12,000 (m/s), temperature coefficient for frequency TCF of from −15 to 15 (ppm/°C.) and effective coupling coefficient $K^2$ of from 0.8 to 2.3 (%). The SAW device is also provided with propagation loss of 0.05 (dB/λ) for 1st mode SAW, and 0.03 (dB/λ) for 2nd mode SAW. Further, such constitution has an advantage in fabricating process.

The second surface acoustic wave device according to the invention may have another constitution in which the parameter $kh_z$ and $kh_s$ are given within a region A-B-C-D-S-T-M-N-O-P-Q-R-A in the two-dimensional Cartesian coordinate graph, the outer edge of the region A-B-C-D-S-T-M-N-O-P-Q-R-A being given by a closed chain in the Cartesian coordinate, consisting of the points A, B, C and D, a point S, a point T, the points M, N, O, P, Q and R and lines A-B, B-C, C-D, D-S, S-T, T-M, M-N, N-O, O-P, P-Q, Q-R and R-A.

The SAW device having this constitution is provided with propagation velocity V of from 10,000 to 12,000 (m/s), temperature coefficient for frequency TCF of from −15 to 15

(ppm/°C.) and effective coupling coefficient $K^2$ of from 1.6 to 2.3 (%). The SAW device is also provided with propagation loss of 0.05 (dB/λ) for 1st mode SAW, and 0.03 (dB/λ) for 2nd mode SAW.

The region A-B-C-D-E-F-G-H-I-J-K-L-M-N-O-P-Q-R-A and the region A-B-C-D-S-T-M-N-O-P-Q-R-A are shown in FIG. 1.

The third SAW device for 2nd mode surface acoustic wave of a wavelength λ (μm) according to the present invention comprises: (i) a diamond layer, (ii) a ZnO layer formed on the diamond layer, the ZnO layer having a thickness $t_z$, (iii) an interdigital transducer (IDT) formed on the ZnO layer, (iv) a $SiO_2$ layer formed over the interdigital transducer onto the ZnO layer, the $SiO_2$ layer having a thickness of $t_s$, and (v) a short circuit electrode formed on the $SiO_2$ layer; wherein a parameter $kh_z=(2\pi/\lambda)t_z$ and a parameter $kh_s=(2\pi/\lambda)t_s$ are given within a region A-B-C-D-E-F-G-H-I-J-K-L-M-N-O-P-Q-R-A in a two-dimensional Cartesian coordinate graph having abscissa axis of $kh_z$ and ordinate axis of $kh_s$, the outer edge of the region A-B-C-D-E-F-G-H-I-J-K-L-M-N-O-P-Q-R-A being given by a closed chain in the Cartesian coordinate, consisting of points A, B, C, D, E, F, G, H, I, J, K, L, M, N, O, P, Q and R and lines A-B, B-C, C-D, D-E, E-F, F-G, G-H, H-I, I-J, J-K, K-L, L-M, M-N, N-O, O-P, P-Q, Q-R and R-A. The layer structure of this SAW device is schematically illustrated in FIG. 2C, "type C".

The SAW device having above constitution is provided with propagation velocity V of from 8,000 to 12,000 (m/s), temperature coefficient for frequency TCF of from −15 to 15 (ppm/°C.) and effective coupling coefficient $K^2$ of from 0.3 to 0.8 (%). The SAW device is also provided with propagation loss of 0.05 (dB/λ) for 1st mode SAW, and 0.03 (dB/λ) for 2nd mode SAW. Further, such constitution has an advantage in fabricating process.

The third surface acoustic wave device according to the invention may have another constitution in which the parameter $kh_z$ and $kh_s$ are given within a region A-B-C-D-S-T-M-N-O-P-Q-R-A in the two-dimensional Cartesian coordinate graph, the outer edge of the region A-B-C-D-S-T-M-N-O-P-Q-R-A being given by a closed chain in the Cartesian coordinate, consisting of the points A, B, C and D, a point S, a point T, the points M, N, O, P, Q and R and lines A-B, B-C, C-D, D-S, S-T, T-M, M-N, N-O, O-P, P-Q, Q-R and R-A.

The SAW device having this constitution is provided with propagation velocity V of from 10,000 to 12,000 (m/s), temperature coefficient for frequency TCF of from −15 to 15 (ppm/°C.) and effective coupling coefficient $K^2$ of from 0.3 to 0.8 (%). The SAW device is also provided with propagation loss of 0.05 (dB/λ) for 1st mode SAW, and 0.03 (dB/λ) for 2nd mode SAW.

The region A-B-C-D-E-F-G-H-I-J-K-L-M-N-O-P-Q-R-A and the region A-B-C-D-S-T-M-N-O-P-Q-R-A are shown in FIG. 1.

The fourth SAW device for 2nd mode surface acoustic wave of a wavelength λ (μm) according to the present invention comprises: (i) a diamond layer, (ii) a short circuit electrode formed on the diamond layer, (iii) a ZnO layer formed over the short circuit electrode onto the diamond layer, the ZnO layer having a thickness $t_z$, (iv) an interdigital transducer (IDT) formed on the ZnO layer, (v) a $SiO_2$ layer formed over the interdigital transducer onto the ZnO layer, the $SiO_2$ layer having a thickness of $t_s$, and (vi) a short circuit electrode formed on the $SiO_2$ layer; wherein a parameter $kh_z=(2\pi/\lambda)t_z$ and a parameter $kh_s=(2\pi/\lambda)t_s$ are given within a region A-B-C-D-E-F-G-H-I-J-K-L-M-N-O-P-Q-R-A in a two-dimensional Cartesian coordinate graph having abscissa axis of $kh_z$ and ordinate axis of $kh_s$, the outer edge of the region A-B-C-D-E-F-G-H-I-J-K-L-M-N-O-P-Q-R-A being given by a closed chain in the Cartesian coordinate, consisting of points A, B, C, D, E, F, G, H, I, J, K, L, M, N, O, P, Q and R and lines A-B, B-C, C-D, D-E, E-F, F-G, G-H, H-I, I-J, J-K, K-L, L-M, M-N, N-O, O-P, P-Q, Q-R and R-A. The layer structure of this SAW device is schematically illustrated in FIG. 2D, "type D".

The SAW device having above constitution is provided with propagation velocity V of from 8,000 to 12,000 (m/s), temperature coefficient for frequency TCF of from −15 to 15 (ppm/°C.) and effective coupling coefficient $K^2$ of from 0.6 to 1.8 (%). The SAW device is also provided with propagation loss of 0.05 (dB/λ) for 1st mode SAW, and 0.03 (dB/λ) for 2nd mode SAW. Further, such constitution has an advantage in fabricating process.

The fourth surface acoustic wave device according to the invention may have another constitution in which the parameter $kh_z$ and $kh_s$ are given within a region A-B-C-D-S-T-M-N-O-P-Q-R-A in the two-dimensional Cartesian coordinate graph, the outer edge of the region A-B-C-D-S-T-M-N-O-P-Q-R-A being given by a closed chain in the Cartesian coordinate, consisting of the points A, B, C and D, a point S, a point T, the points M, N, O, P, Q and R and lines A-B, B-C, C-D, D-S, S-T, T-M, M-N, N-O, O-P, P-Q, Q-R and R-A.

The SAW device having this constitution is provided with propagation velocity V of from 10,000 to 12,000 (m/s), temperature coefficient for frequency TCF of from −15 to 15 (ppm/°C.) and effective coupling coefficient $K^2$ of from 0.8 to 1.8 (%). The SAW device is also provided with propagation loss of 0.05 (dB/λ) for 1st mode SAW, and 0.03 (dB/λ) for 2nd mode SAW.

The region A-B-C-D-E-F-G-H-I-J-K-L-M-N-O-P-Q-R-A and the region A-B-C-D-S-T-M-N-O-P-Q-R-A are shown in FIG. 1.

In each constitution of the first, second, third and fourth SAW devices according to the present invention, IDT is formed on ZnO layer, and not has a constitution in which IDT is enclosed by ZnO layer. That is, qualities of ZnO layer such as material uniformity are not adversely affected by the presence of IDT within the ZnO layer. Thus, improved performances such as lower propagation loss can be achieved with these constitutions.

The fifth SAW device for 2nd mode surface acoustic wave of a wavelength λ (μm) according to the present invention comprises: (i) a diamond layer, (ii) an interdigital transducer (IDT) formed on the diamond layer, (iii) a ZnO layer formed over the interdigital transducer onto the diamond layer, the ZnO layer having a thickness $t_z$, (iv) a short circuit electrode formed on the ZnO layer, and (v) a $SiO_2$ layer formed over the short circuit electrode onto the ZnO layer, the $SiO_2$ layer having a thickness of $t_s$; wherein a parameter $kh_z=(2\pi/\lambda)t_z$ and a parameter $kh_s=(2\pi/\lambda)t_s$ are given within a region A-B-C-D-E-F-G-H-I-J-K-L-M-N-O-P-Q-R-A in a two-dimensional Cartesian coordinate graph having abscissa axis of $kh_z$ and ordinate axis of $kh_s$, the outer edge of the region A-B-C-D-E-F-G-H-I-J-K-L-M-N-O-P-Q-R-A being given by a closed chain in the Cartesian coordinate, consisting of points A, B, C, D, E, F, G, H, I, J, K, L, M, N, O, P, Q and R and lines A-B, B-C, C-D, D-E, E-F, F-G, G-H, H-I, I-J, J-K, K-L, L-M, M-N, N-O, O-P, P-Q, Q-R and R-A. The layer structure of this SAW device is schematically illustrated in FIG. 2F, "type F".

The SAW device having above constitution is provided with propagation velocity V of from 8,000 to 12,000 (m/s), temperature coefficient for frequency TCF of from −15 to 15 (ppm/°C.) and effective coupling coefficient $K^2$ of from 0.15 to 1.4 (%). The SAW device is also provided with propagation loss of 0.05 (dB/λ) for 1st mode SAW, and 0.03 (dB/λ) for 2nd mode SAW. Further, such constitution has an advantage in fabricating process.

The fifth surface acoustic wave device according to the invention may have another constitution in which the parameter $kh_z$ and $kh_s$ are given within a region A-B-C-D-S-T-M-N-O-P-Q-R-A in the two-dimensional Cartesian coordinate graph, the outer edge of the region A-B-C-D-S-T-M-N-O-P-Q-R-A being given by a closed chain in the Cartesian coordinate, consisting of the points A, B, C and D, a point S, a point T, the points M, N, O, P, Q and R and lines A-B, B-C, C-D, D-S, S-T, T-M, M-N, N-O, O-P, P-Q, Q-R and R-A.

The SAW device having this constitution is provided with propagation velocity V of from 10,000 to 12,000 (m/s), temperature coefficient for frequency TCF of from −15 to 15 (ppm/°C.) and effective coupling coefficient $K^2$ of from 0.4 to 1.4 (%). The SAW device is also provided with propagation loss of 0.05 (dB/λ) for 1st mode SAW, and 0.03 (dB/λ) for 2nd mode SAW.

The region A-B-C-D-E-F-G-H-I-J-K-L-M-N-O-P-Q-R-A and the region A-B-C-D-S-T-M-N-O-P-Q-R-A are shown in FIG. 1.

The first to the fifth SAW devices according to the present invention can achieve improved performances for 2nd mode SAW. The advantage of the SAW device for 2nd mode SAW is that the propagation loss of the device for 2nd mode is lower than that for 1st mode. Therefore, lower propagation loss can be added with the SAW device having higher V and $K^2$ and desirable TCF according to the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
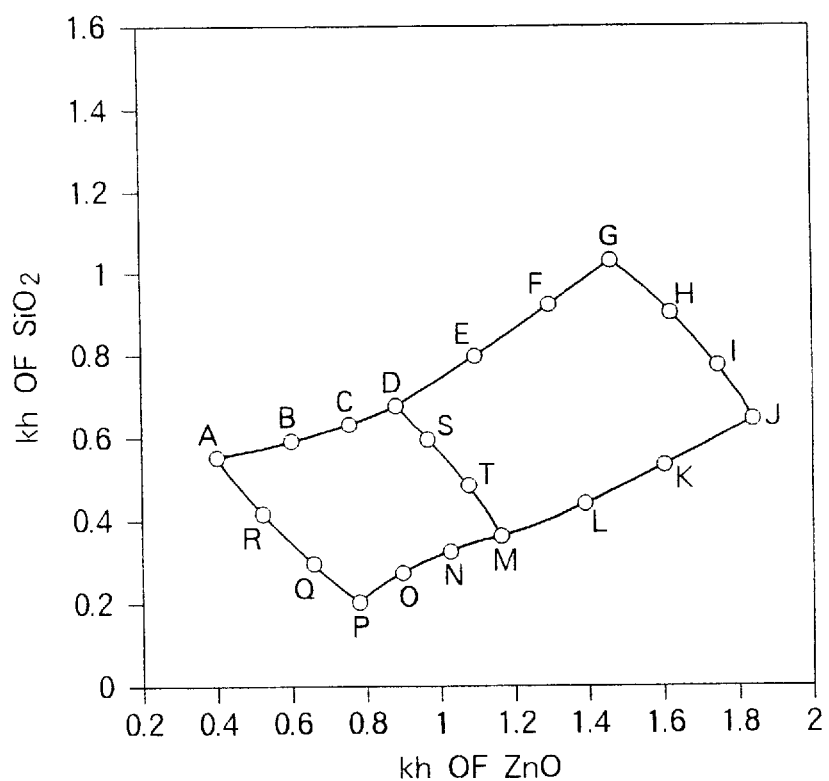
FIG. 1 is a graph in the two-dimensional Cartesian coordinate having abscissa axis of $kh_z$ and ordinate axis of $kh_s$, illustrating the region A-B-C-D-E-F-G-H-I-J-K-L-M-N-O-P-Q-R-A and the region A-B-C-D-S-T-M-N-O-P-Q-R-A.

The present invention will be described in detail as following, with reference to the accompanying drawings.
(Diamond)

The diamond material preferable for the use in the present invention may be either natural diamond or synthetic diamond. The diamond may be single crystalline diamond or polycrystalline diamond. The diamond plate/substrate itself can be used for fabricating SAW devices according to the present invention. Diamond layer/film formed on the other base material can also be employed.

The base material used for forming diamond film is not particularly limited, but may appropriately be selected depending on the usage of the SAW device. For example, the base material to be available in the present invention may comprise semiconductor materials such as crystalline silicon, amorphous silicon, metals, glass and ceramics. The process may appropriately be selected from known synthesis processes such as CVD(Chemical Vapor Deposition) including microwave plasma CVD, plasma enhanced CVD, PVD (Physical Vapor Deposition), sputtering, ion plating, plasma jet method, flame method and hot filament method.

In the case where the diamond film formed on the base material is employed for fabrication of SAW device according to the present invention, a parameter $kh_d$, which is defined as $kh_d = 2\pi t/\lambda$, where $t_d$ is a thickness of the diamond film/layer and λ is a wavelength of SAW, is preferably 4 or higher, and more preferably $kh_d$ is 8 or higher, because such thicker diamond film can provides less fluctuation in operating performances of the SAW device.

The plane orientation of the diamond may be any of (111), (100) and (110), etc., or may be any combination of these plane orientations.
(ZnO layer)

ZnO layer, that is disposed on the diamond and functions as piezoelectric layer of the SAW device according to the present invention, is preferably polycrystalline, and c-axis oriented, in view of piezoelectric property. By "c-axis oriented", it is meant that ZnO layer have a (001) plane that is parallel to a base layer, such as diamond layer, on which the ZnO layer is disposed.
(SiO$_2$ layer)

SiO$_2$ layer, that is formed on the ZnO layer and functions as protecting or passivating material for the ZnO layer and IDT according to the present invention, is preferably an amorphous $SiO_2$ layer, in view of formability and processability.

When device temperature increases, the SAW propagation velocity through $SiO_2$ layer increases while the SAW propagation velocities through diamond and ZnO layer decrease. Thus, $SiO_2$ layer can compensate the variation of the SAW propagation velocity through diamond and ZnO layers to provide the operation stability for temperature variation.

(IDT)

In the present invention, a pair of IDTs are disposed at input side and output side. Any of electric conductive materials can be used for interdigital transducer for the SAW device of the present invention. In view of processability, Al (aluminum) may preferably be used as the material for the IDT.

The thickness of the IDT is not limited, as long as it functions as an IDT of a SAW device. In general, the thickness of the IDT may typically be in the range of about 100 to about 5,000 Å (more preferably, about 100 to 500 Å). When the thickness of the IDT is less than 100 Å, the electrode resistivity is increased, causing considerable energy loss. On the other hand, when the thickness of the IDT exceeds 5,000 Å, considerable mass addition effect cause reflection of SAW, and desired SAW characteristic of the SAW device may suffer.

Figure 12A:
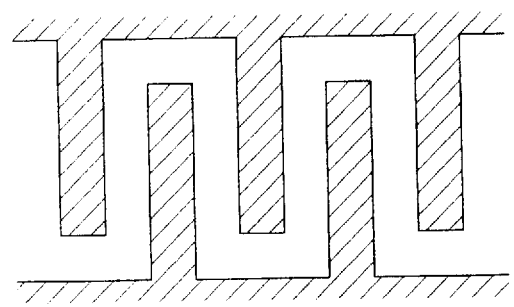
FIG. 12A schematically illustrates a planar shape of an IDT (single-type electrode)

The planar or projected shape of the IDT for the SAW device of the present invention is not limited. Electrode called "single-type" electrode as shown in the schematic plan view of FIG. 12A or electrode called "double-type" electrode as shown in the schematic plan view of FIG. 12B may typically be used for the present invention.

(Short-Circuiting Electrode)

The short-circuiting electrode to be disposed as desired, is an electrode having a function of providing an equipotential state to an electric field so as to change the SAW characteristics of the device. This electrode may preferably comprise a (thin) film of a metal such as Al, Au or Al-Cu. Since the short-circuiting electrode has different function from that of the IDT, the material of the short-circuiting electrode may not be same as that of the IDT.

The thickness of the short-circuiting electrode is not particularly limited, as long as it can function as a short-circuiting electrode of a SAW device. The thickness of the short-circuiting electrode may preferably be in the range of about 50 to 3,000 Å (more preferably, about 100 to 500 Å). When the thickness is less than 50 Å, it is difficult to obtain an equipotential state as described above. On the other hand, when the thickness exceeds 3,000 Å, it may affect the reflection of SAW.

For example, the short-circuiting electrode may preferably has a planner shape of a "solid electrode" having an area substantially equal to that of the IDT to be used in combination therewith.

EXAMPLES

Example 1

Figure 2A:
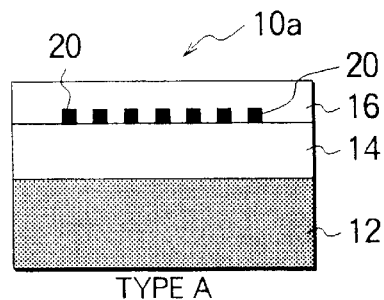
FIGS. 2A to 2G are schematic sectional views illustrating layer structures (type A to type G) according to the present invention.
Figure 2B:
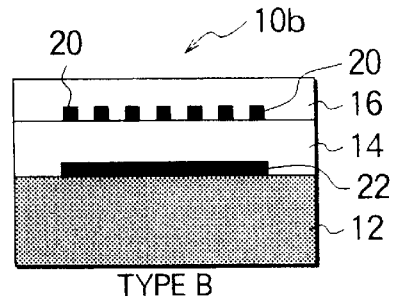
Figure 2C:
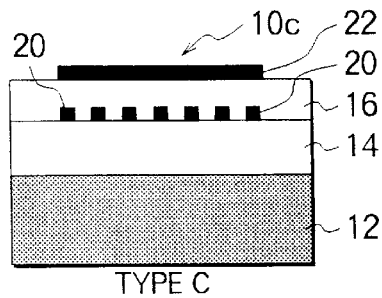
Figure 2D:
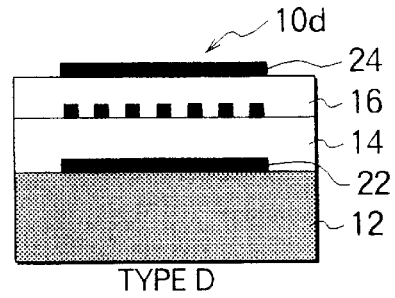
Figure 2E:
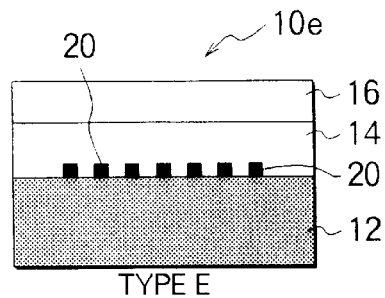
Figure 2F:
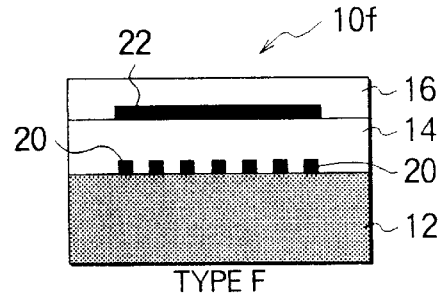
Figure 2G:
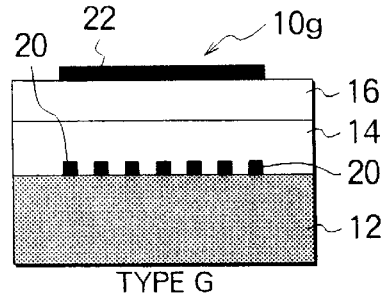

The "type A" of SAW devices, illustrated in FIG. 2A, having different thickness of layers 14 and 16, were prepared, and the desired thickness of ZnO and $SiO_2$ layers were evaluated for 2nd SAW mode so as to provide improved propagation velocity (V), effective coupling coefficient $K^2$, temperature coefficient for frequency TCF and propagation loss.

More specifically, each of the SAW devices of Examples 1 includes: a 20 μm thick of diamond 20; one of ten different thicknesses within the range of 0.25 to 2.5 μm of ZnO layer; and one of ten different thicknesses within the range of 0.20 to 2.0 μm of $SiO_2$.

The desired thicknesses of ZnO and $SiO_2$ layers are expressed by the parameters $kh_z$ and $kh_s$ for 2nd mode SAW having wavelength λ:

$kh_z = 2\pi t_z/\lambda$, $t_z$: thickness of ZnO layer; and $kh_s = 2\pi t_s/\lambda$, $t_s$: thickness of $SiO_2$ layer.

A polycrystalline diamond film was formed on a (100) plane of monocrystalline silicon having dimension of 10×10×1 (mm) by microwave plasma CVD process. The Silicon substrate was placed within a vacuum CVD chamber of a microwave plasma CVD apparatus, and the CVD chamber was evacuated. Then a reactant gas which contains $CH_4$ and $H_2(CH_4:H_2=1:200)$ was introduced. Diamond layer 12 having thickness of 20 μm was then deposited in the plasma created under the condition of: microwave power of 400 W, pressure of about 40 Torr and temperature of 850° C. The deposited diamond layer was allowed to stand for 10 minutes in the air of 450° C., to enhance the resistance of diamond layer.

After the deposited diamond surface was polished, the Si substrate having diamond layer thereon was transferred to a vacuum chamber of a magnetron sputtering apparatus to deposit ZnO layer 14 onto the diamond layer 12. A polycrystalline ZnO target was included within the chamber. The ZnO target was sputtered with flowing a sputtering gas containing Ar and $O_2$ (Ar:$O_2$=1:1) through the chamber, under the sputtering condition of: sputtering power of 150 W and substrate temperature of 380° C.

Figure 12B:
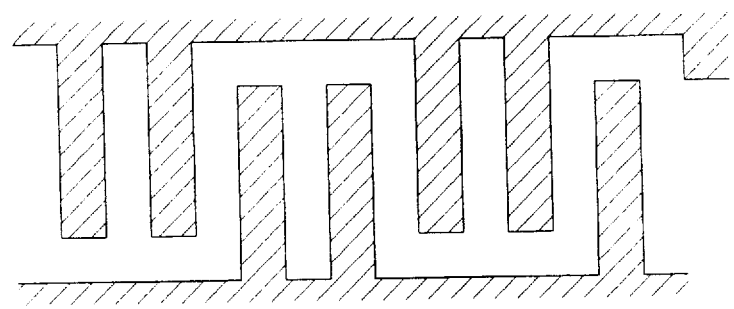
FIG. 12B schematically illustrates a planar shape of an IDT (double-type electrode).

Aluminum IDTs 20 having planer shape of double-type electrode as shown in FIG. 12B (electrode element width d=1 μm, pitch=8 μm, thickness=400 Å) were formed on ZnO layer 14 by resistance heating processing and subsequent etching.

Then, after ZnO target was substituted by Si target, an $SiO_2$ layer 16 having predetermined thickness was formed over the IDTs via RF sputtering process under the condition of: pressure of $1 \times 10^{-2}$ Torr, substrate temperature of 150° C. and Ar:$O_2$=1:1, RF power of 200 W.

With respect to each of the SAW devices illustrated in FIG. 2A, radio frequency (RF) power was applied to the input IDT to generate SAW of 2nd mode. The propagation velocities V (m/s) of the generated SAW of 2nd mode were determined depending on a relationship of V=f×λ (f: center frequency, λ=8d=8 μm). The effective coupling coefficient ($K^2$) was also evaluated by measuring the radiation conductance (wherein the real part is denoted by "G") of the IDT by using a network analyzer ("Network Analyzer 8719A", commercially available from Yokogawa Hewlett Packard (YHP), Japan), and by using following formula:

$$K^2 = (G/8) \cdot f_0 \cdot C \cdot N$$

($f_0$: center frequency, C: total electrostatic capacitance of IDT, N: number of electrode element pairs of IDT).

TCF measurement was carried out by the following manner: SAW device was heated by an external heater from room temperature to 70° C. The central frequency $F_0$ was measured at every 10° C. from the room temperature to 70° C. Proportional relationship between the central frequency and the device temperature. TCF was given by the slope of the relationship.

Further, propagation loss was evaluated by the following manner: SAW devices having same layer/electrode constitution but different spacing between input IDT and output IDT (e.g., 50 wavelength, 100 wavelength and 150 wave length) were fabricated. A relationship of insertion loss with the spacing was evaluated to be proportional. Then the propagation loss was obtained by the slop of the relationship.

The thickness $t_z$ (μm) of the ZnO layers of each SAW devices, and the thickness $t_s$ (μm) of the SiO$_2$ layers of each SAW device were measured by cutting off the device after the measurement of device performances as described above, and observing the resultant section of the device with a scanning electron microscope (SEM) at a magnification of 1000–5000×. Thus, the values of the parameters of $kh_z 2\pi$ ($t_z/\lambda$) and $kh_s=2\pi(t_s/\lambda)$ were determined for each of the SAW devices.

Figure 3:
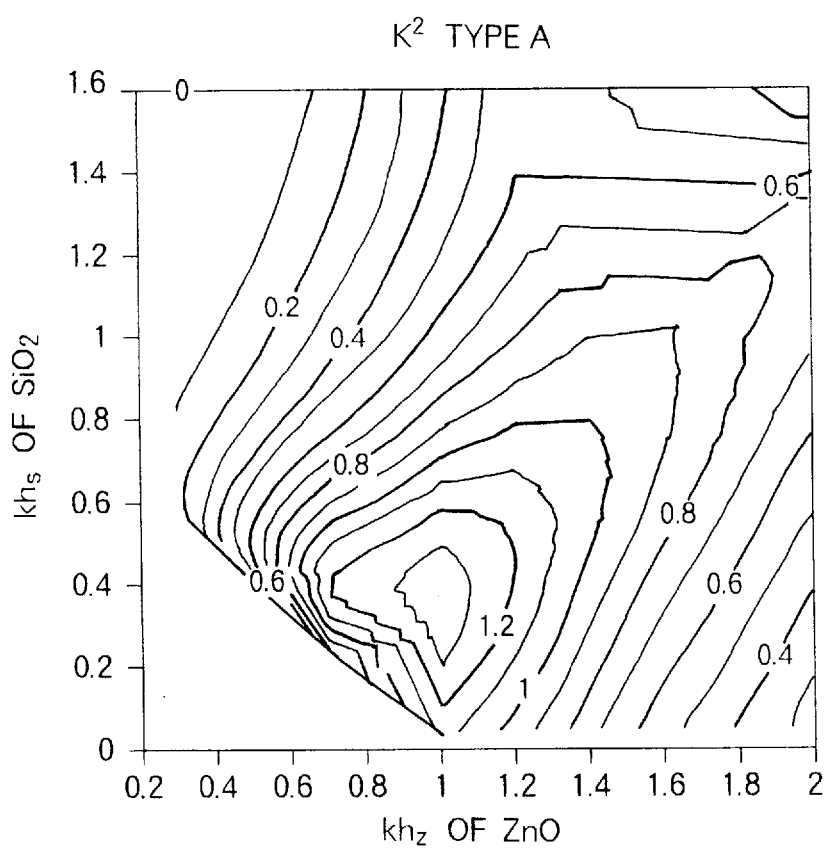
FIG. 3 is a graph showing relationship of parameters $kh_z$ and $kh_s$ for the SAW device of "type A" at various effective coupling coefficients $K^2$s, which was obtained in Example 1.

Variation of the effective coupling coefficient $K^2$ with the thickness of ZnO layer 14 and SiO$_2$ layer is illustrated in FIG. 3. FIG. 3 is a graph having abscissa axis of $kh_z$ and ordinate axis of $kh_s$, showing the relationship of the parameters $kh_z$ and $kh_s$ at the given effective coupling coefficient $K^2$. The numerical value at each curve is the value of $K^2$ in %.

Figure 10:
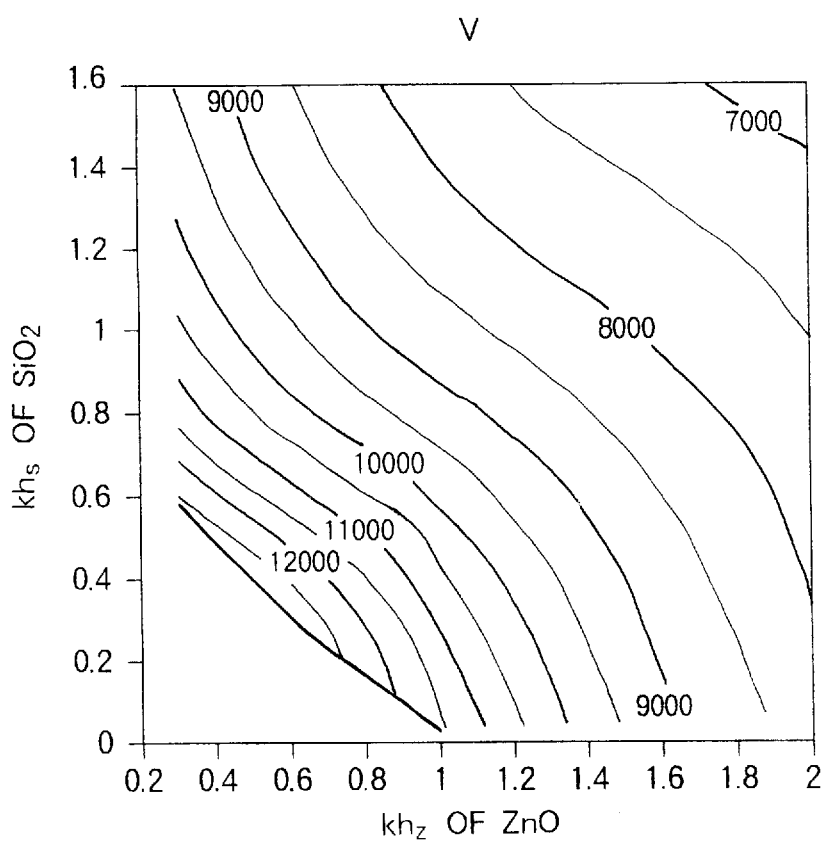
FIG. 10 is a graph showing relationship of parameters $kh_z$ and $kh_s$ for the SAW device of "type A", "type B", "type C", "type D", "type E", "type F" and "type G", at various propagation velocities Vs.
Figure 11:
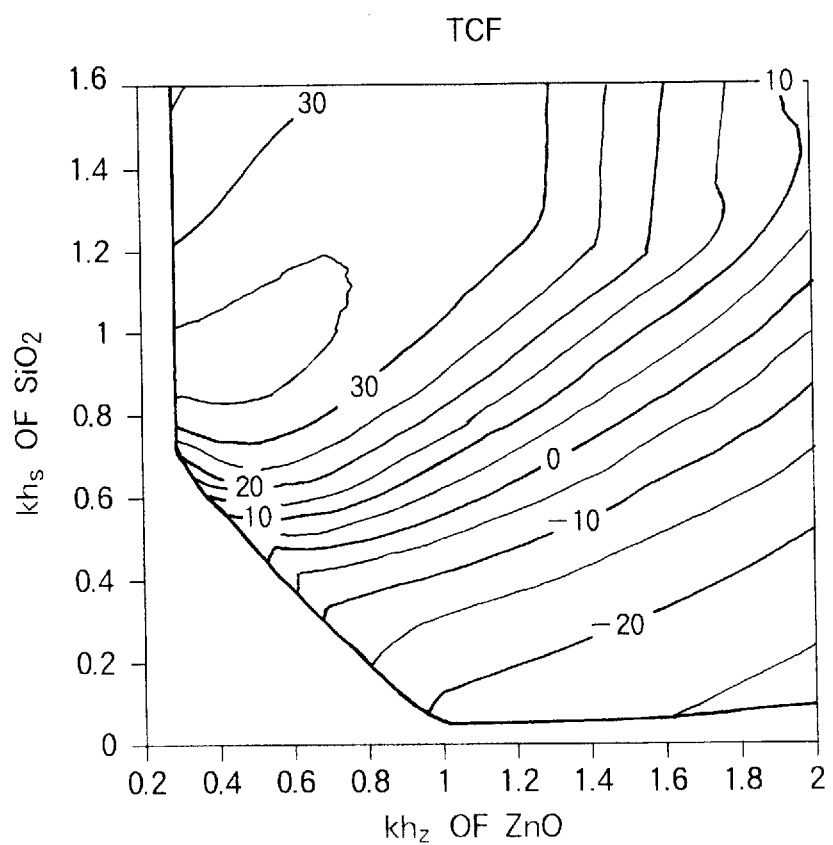
FIG. 11 is a graph showing relationship of parameters $kh_z$ and $kh_s$ for the SAW device of "type A", "type B", "type C", "type D", "type E", "type F" and "type G", at various TCFs.

Similarly, the relationship of the propagation velocity V (m/sec) with the parameters $kh_z=2\pi(t_z/\lambda)$ and $kh_s=2\pi(t_s/\lambda)$ is also shown in FIG. 10. The relationship of TCF (ppm/°C.) with these parameters is also shown in FIG. 11.

Further, measured propagation loss was 0.05 dB/wavelength for 1st mode SAW, and 0.03 dB/wavelength for 2nd mode SAW.

Examples 2–7

In Examples 2–7, following SAW devices were fabricated by similar fabricating processes as used in Example 1: "type B" SAW device 10b was made in Example 2; "type C" SAW device 10c was made in Example 3; "type D" SAW device 10d was made in Example 4; "type E" SAW device 10e was made in Example 5; "type F" SAW device 10f was made in Example 6; and "type G" SAW device log was made in Example 7.

As seen in these figures, the arrangement of IDT is different by Examples. In Example 2 (type B), Example 3 (type C) and Example 4 (type D), IDT 20 was formed onto ZnO layer 14 after ZnO layer 14 had been deposited, as described in Example 1. In Example 5 (type E), Example 6 (type F) and Example 7 (type G), IDT 20 was formed by the same forming process as used in Example 1, after polishing the surface of diamond layer 12 and before depositing ZnO layer; and then ZnO layer 14 was deposited onto diamond layer 12 to cover IDT 20.

In Example 2 (type B), Example 3 (type C), Example 4 (type D), Example 6 (type F) and Example 7 (type G), short circuiting electrodes 22 and 24 are included in the SAW device. The formation of the short circuiting electrodes 22 and 24 was carried out by the following manner: in Examples 2 (B) and 6 (F), after diamond 12 was deposited and polished, an aluminum layer having thickness of 250 angstrom was formed by resistive heating method. Then the aluminum layer was patterned via conventional photolithography to form short circuiting electrode 22, which has a geometry corresponding to the location of IDT 20. In Example 3 (C) and Example 7 (G), short circuiting electrode 22, which has a geometry corresponding to the location of IDT 20, was formed on SiO$_2$ layer 16 via similar process as used in Examples 2 and 6, after depositing SiO$_2$ layer 16. In Example 4, short circuiting electrode 22 was formed onto diamond 12, and short circuiting electrode 24 was formed onto ZnO layer 14. In both formation processes for electrodes 2 and 24, similar processing as used in Examples 2 and 3 was employed. Each of electrodes 22 and 24 has a geometry corresponding to the location of IDT 20.

As carried out in Example 1, plurality of SAW devices having different thickness of layers 14 and 16, were prepared in each Example, and the desired thickness of ZnO and SiO$_2$ layers were evaluated for 2nd SAW mode so as to provide improved propagation velocity (V), effective coupling coefficient $K^2$, temperature coefficient for frequency TCF and propagation loss.

More specifically, each of the SAW devices of each of the Examples 2–7 includes: a 20 μm thick of diamond 20; one of ten different thicknesses within the range of 0.25 to 2.5 μm of ZnO layer; and one of ten different thicknesses within the range of 0.20 to 2.0 μm of SiO$_2$. The desired thicknesses of ZnO and SiO$_2$ layers are expressed by the parameters $kh_z$ and $kh_s$ for 2nd mode SAW having wavelength λ, as in Example 1:

$kh_z=2\pi t_z/\lambda$, $t_z$:thickness of ZnO layer; and $kh_s=2\pi t_s/\lambda$, $t_s$:thickness of SiO$_2$ layer.

Effective coupling coefficient $K^2$ of each of the SAW devices was evaluated by similar manner as used in Example 1.

Figure 4:
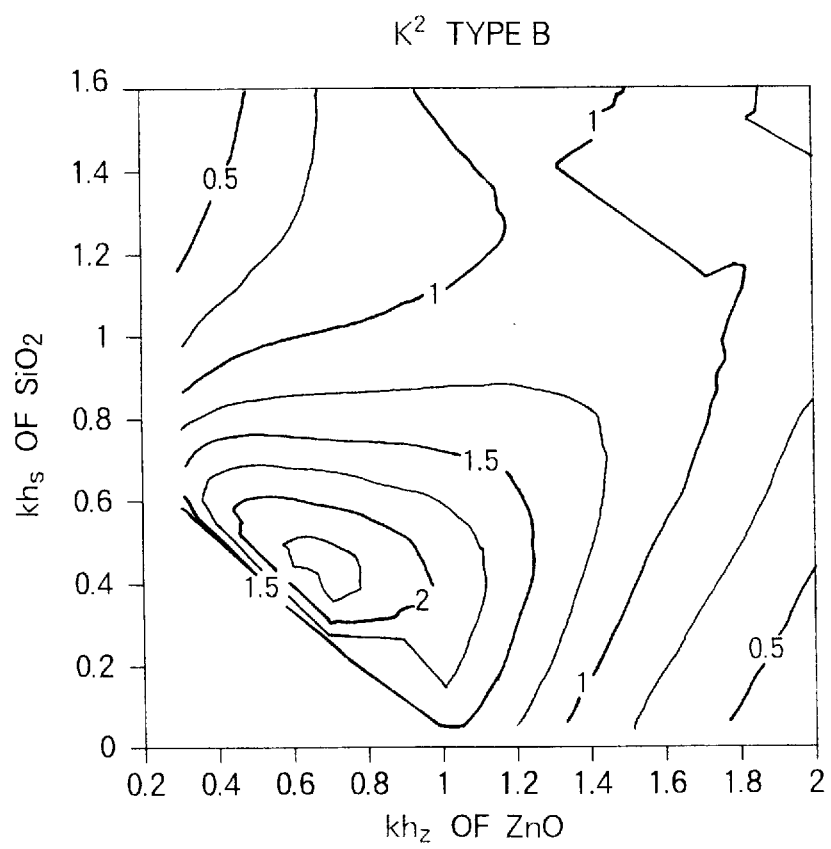
FIG. 4 is a graph showing relationship of parameters $kh_z$ and $kh_s$ for the SAW device of "type B" at various effective coupling coefficients $K^2$ s which was obtained in Example 2.
Figure 5:
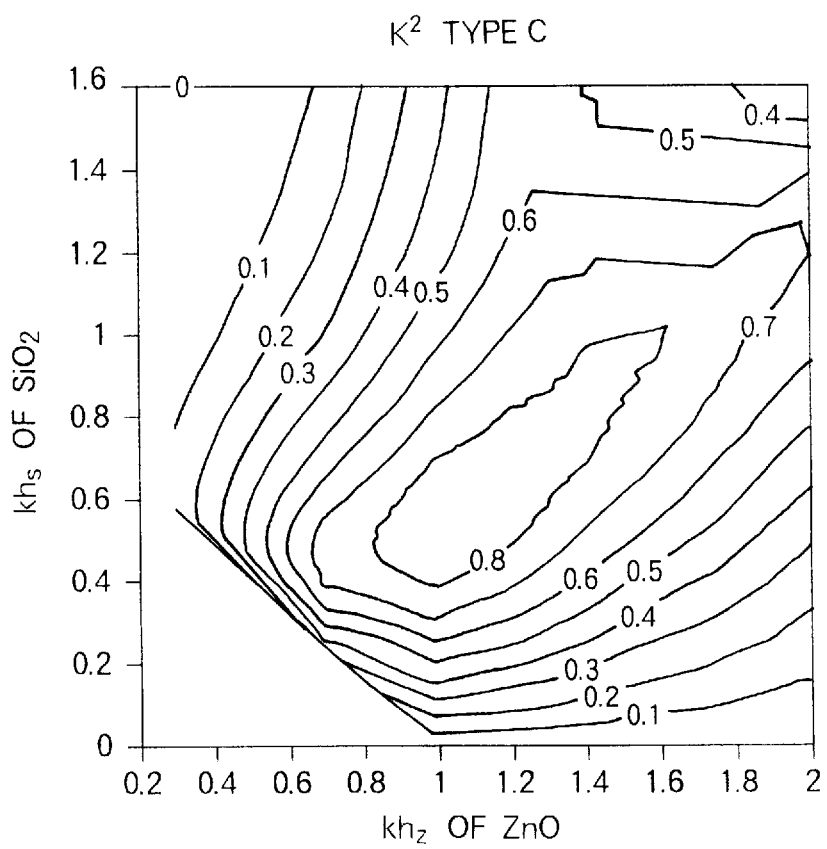
FIG. 5 is a graph showing relationship of parameters $kh_z$ and $kh_s$ for the SAW device of "type C" at various effective coupling coefficients K2s which was obtained in Example 3.
Figure 6:
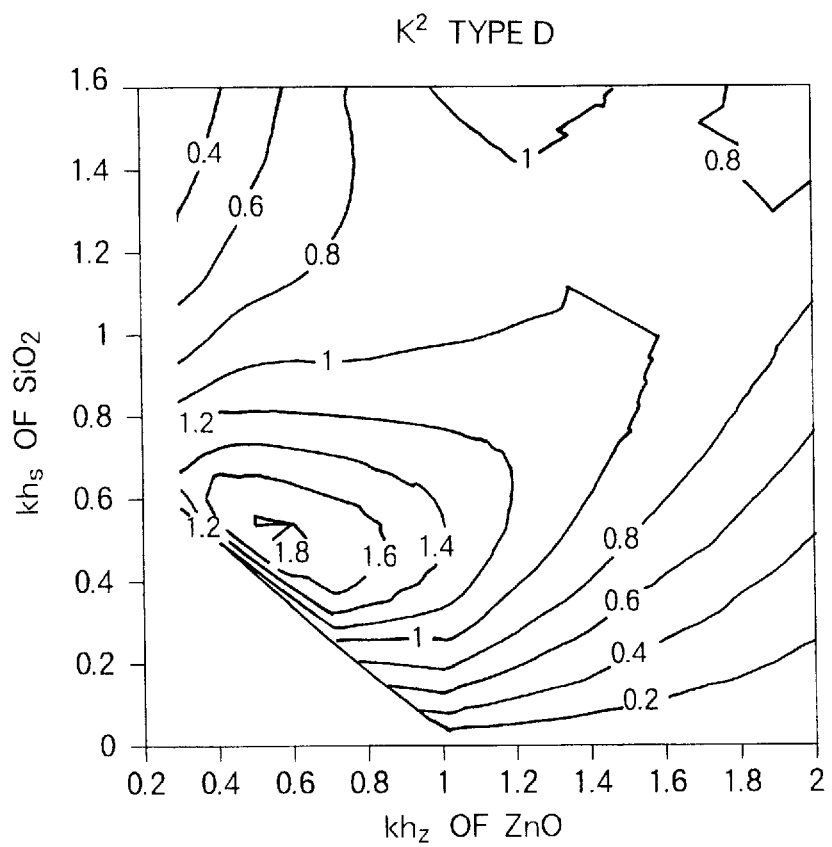
FIG. 6 is a graph showing relationship of parameters $kh_z$ and $kh_s$ for the SAW device of "type D" at various effective coupling coefficients $K^2$s, which was obtained in Example 4.
Figure 7:
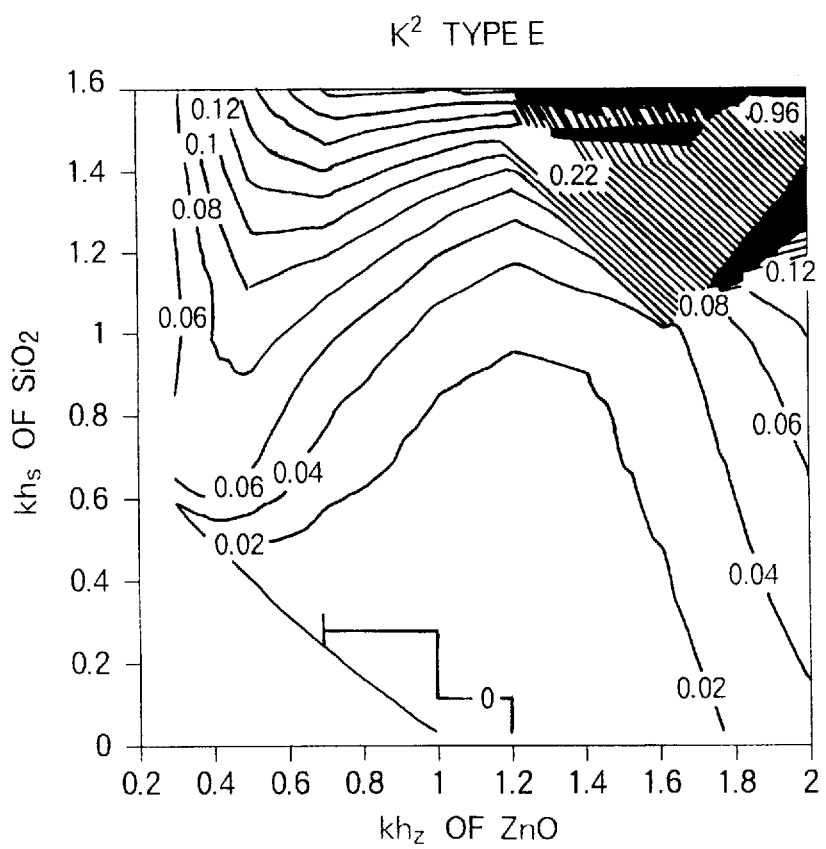
FIG. 7 is a graph showing relationship of parameters $kh_z$ and $kh_s$ for the SAW device of "type E" at various effective coupling coefficients $K^2$s, which was obtained in Example 5.
Figure 8:
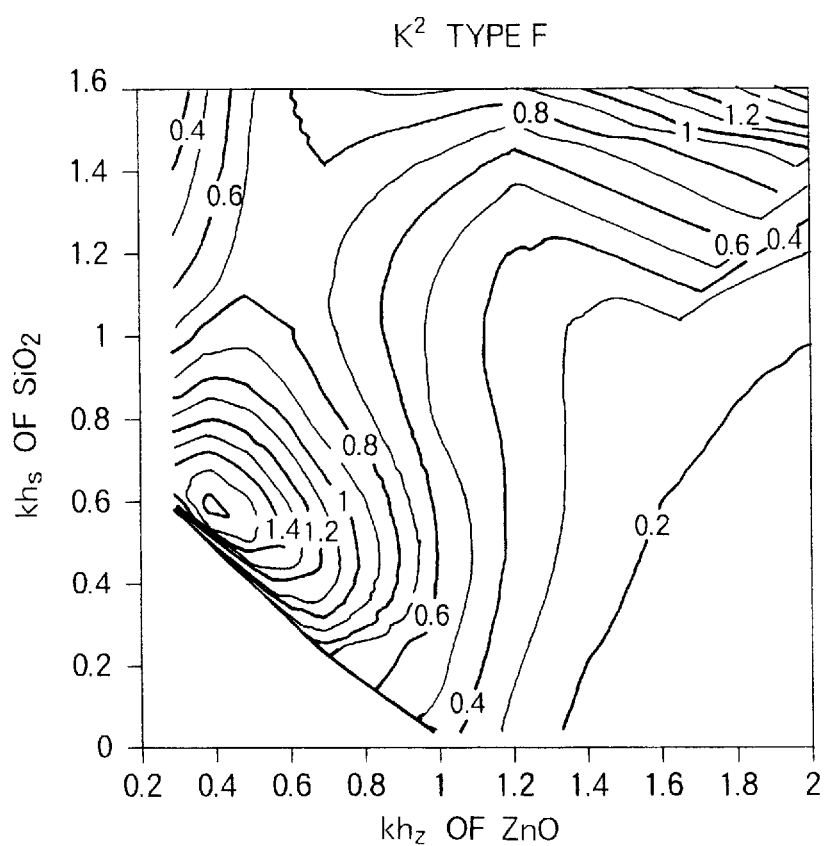
FIG. 8 is a graph showing relationship of parameters $kh_z$ and $kh_s$ for the SAW device of "type F" at various effective coupling coefficients $K^2$s, which was obtained in Example 6.
Figure 9:
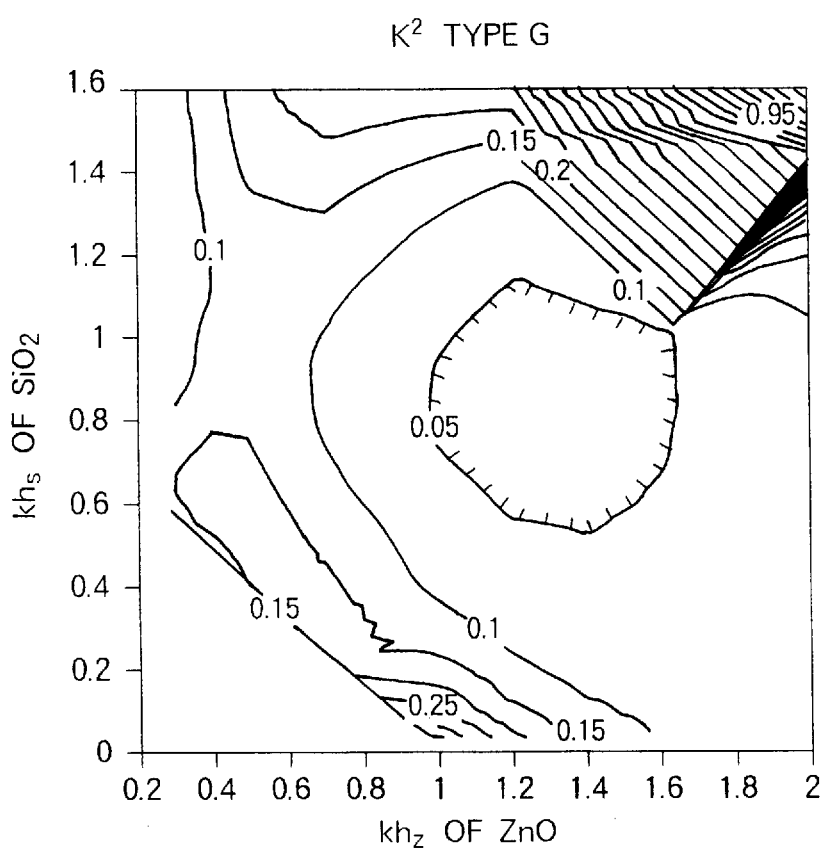
FIG. 9 is a graph showing relationship of parameters $kh_z$ and $kh_s$ for the SAW device of "type G" at various effective coupling coefficients $K^2$s, which was obtained in Example 7.

Variation of the effective coupling coefficient $K^2$ (%) with the thickness of ZnO layer 14 and SiO$_2$ layer is illustrated in FIGS. 4 to 9. FIGS. 4 to 9 are graph having abscissa axis of $kh_z$ and ordinate axis of $kh_s$, showing the relationship of the parameters $kh_z$ and $kh_s$ at the given effective coupling coefficient $K^2$ in Examples 2 to 7, respectively. The numerical value at each curve is the value of $K^2$ in %. FIG. 4 illustrates the relationship obtained in Example 2; FIG. 5 shows the results of Example 3; FIG. 6 shows the results of Example 4; FIG. 7 shows the results of Example 5; FIG. 8 shows the results of Example 6; and FIG. 9 shows the results of Example 7.

Propagation velocity V (m/sec) and TCF (ppm/°C.) of each of the SAW devices were obtained by similar manner as used in Example 1. The same result as in Example 1 in relationship of V with $kh_z$ and $kh_s$, is obtained in each of Example 2–7. Thus, the relationship of the propagation velocity V (m/sec) with the parameters $kh_z=2\pi(t_z/\lambda)$ and $kh_s=2\pi(t_s/\lambda)$ in Each of Example 2–7 is shown in FIG. 10. In TCF, the same result as in Example 1 is also obtained in each of Example 2–7. Thus, the relationship of TCF (ppm/°C.) with these parameters is also shown in FIG. 11.

Further, measured propagation loss was 0.05 dB/wavelength for 1st mode SAW, and 0.03 dB/wavelength for 2nd mode SAW, in each of Examples 2–7.

Evaluation of the obtained result in Examples 1–7

As described in above Examples 1 to 7, a series of efforts on optimization of the thickness of piezoelectric ZnO layer 14 and passivating SiO$_2$ layer 16 were carried out for the SAW devices of various electrode constitution as illustrated in FIGS. 2A to 2G. A number of obtained results were collectively analyzed and evaluated to provide the optimized relationships of $kh_z$ and $kh_s$ for each constitution of SAW devices according to the present invention. Thus, dimensionless thicknesses of ZnO and SiO$_2$ layers 14 and 16 for each constitution of SAW devices according to the present invention were obtained for given wavelength of SAW. In the evaluation on the basis of the obtained results of Examples, significant improvement in device performances was achieved by optimizing dimensionless thicknesses $kh_z$ and $kh_s$ for the SAW devices having layer/electrode constitutions of "type A", "type B", "type C", "type D" and "type F".

The distribution of the optimized values of $kh_z$ and $kh_s$, which is obtained by the evaluation of results of Examples 1 to 7, is shown in FIG. 1.

It was found that the SAW device having improved performances can be fabricated to have ZnO and SiO$_2$ layers, that have the optimized dimensionless thickness $kh_z$ and $kh_s$ given in the region A-B-C-D-E-F-G-H-I-J-K-L-M-N-O-P-Q-R-A, outer edge of which is given by a closed chain consisting of points A, B, C, D, E, F, G, H, I, J, K, L, M, N, O, P, Q and R and lines A-B, B-C, C-D, D-E, E-F, F-G, G-H, H-I, I-J, J-K, K-L, L-M, M-N, N-O, O-P, P-Q, Q-R and R-A. This region is shown in FIG. 1.

It was also found that the SAW device is provided with further improved performances, when the SAW device have ZnO and $SiO_2$ layers, that have the optimized dimensionless thickness $kh_z$ and $kh_s$ given in the region A-B-C-D-S-T-M-N-O-P-Q-R-A, outer edge of which is given by a closed chain consisting of points A, B, C, D, S, T, M, N, O, P, Q and R and lines A-B, B-C, C-D, D-S, S-T, T-M, M-N, N-O, O-P, P-Q, Q-R and R-A. This region is also shown in FIG. 1.

Here, the point A in FIG. 1 occupies a point (0.4, 0.55) in the two-dimensional Cartesian coordinate graph ($kh_z$, $kh_s$) having abscissa axis of $kh_z$ and ordinate axis of $kh_s$. That is, the point A represents $kh_z$=0.4 and $kh_s$=0.55.

The Points B to T in the coordinate graph ($kh_z$, $kh_s$) also represent the following points:

B:(0.6,0.6);
C:(0.75,0.63);
D(0.88,0.68);
E(1.1,0.8);
F(1.3,0.93);
G(1.47,1.03);
H(1.61,0.92);
I(1.75,0.77);
J(1.82,0.64);
K(1.6,0.54);
L(1.41,0.42);
M(1.19,0.35);
N(1.03,0.32);
O(0.92,0.28);
P(0.8,0.2);
Q(0.66,0.3);
R(0.53,0.42);
S(0.98,0.6); and
T(1.1,0.5).

The improved performances can be seen with reference to FIGS. 3 to 11. The detailed improvement will described for SAW devices of types A, B, C, D and F.

Improvement in performances of type A SAW devices

In the "type A" SAW device according to the present invention, the device having ZnO and $SiO_2$ layers, that have the optimized dimensionless thickness $kh_z$ and $kh_s$ given in the region A-B-C-D-E-F-G-H-I-J-K-L-M-N-O-P-Q-R-A, shown in FIG. 1, for 2nd mode surface acoustic wave (SAW), was provided with propagation velocity V of from 8,000 to 12,000 (m/s), temperature coefficient for frequency TCF of from −15 to 15 (ppm/°C.) and effective coupling coefficient $K^2$ of from 0.4 to 1.3 (%). The SAW device is also provided with propagation loss of 0.05 (dB/λ) for 1st mode SAW, and 0.03 (dB/λ) for 2nd mode SAW. Further, such constitution has an advantage in fabricating process.

Further, in the "type A" SAW device according to the present invention, the further optimized dimensionless thickness $kh_z$ and $kh_s$ given in the region A-B-C-D-S-T-M-N-O-P-Q-R-A, shown in FIG. 1, for 2nd mode surface acoustic wave (SAW), achieved propagation velocity V of from 10,000 to 12,000 (m/s), temperature coefficient for frequency TCF of from −15 to 15 (ppm/°C.) and effective coupling coefficient $K^2$ of from 0.4 to 1.3 (%). The SAW device is also provided with propagation loss of 0.05 (dB/λ) for 1st mode SAW, and 0.03 (dB/λ) for 2nd mode SAW. Further, such constitution has an advantage in fabricating process.

Improvement in performances of type B SAW devices

In the "type B" SAW device according to the present invention, the device having ZnO and $SiO_2$ layers, that have the optimized dimensionless thickness $kh_z$ and $kh_s$ given in the region A-B-C-D-E-F-G-H-I-J-K-L-M-N-O-P-Q-R-A, shown in FIG. 1, for 2nd mode surface acoustic wave (SAW), was provided with propagation velocity V of from 8,000 to 12,000 (m/s), temperature coefficient for frequency TCF of from −15 to 15 (ppm/°C.) and effective coupling coefficient $K^2$ of from 0.8 to 2.3 (%). The SAW device is also provided with propagation loss of 0.05 (dB/λ) for 1st mode SAW, and 0.03 (dB/λ) for 2nd mode SAW. Further, such constitution has an advantage in fabricating process.

Further, in the "type B" SAW device according to the present invention, the further optimized dimensionless thickness $kh_z$ and $kh_s$ given in the region A-B-C-D-S-T-M-N-O-P-Q-R-A, shown in FIG. 1, for 2nd mode surface acoustic wave (SAW), achieved propagation velocity V of from 10,000 to 12,000 (m/s), temperature coefficient for frequency TCF of from −15 to 15 (ppm/°C.) and effective coupling coefficient $K^2$ of from 1.6 to 1.3 (%). The SAW device is also provided with propagation loss of 0.05 (dB/λ) for 1st mode SAW, and 0.03 (dB/λ) for 2nd mode SAW. Further, such constitution has an advantage in fabricating process.

Improvement in performances of type C SAW devices

In the "type C" SAW device according to the present invention, the device having ZnO and $SiO_2$ layers, that have the optimized dimensionless thickness $kh_z$ and $kh_s$ given in the region A-B-C-D-E-F-G-H-I-J-K-L-M-N-O-P-Q-R-A, shown in FIG. 1, for 2nd mode surface acoustic wave (SAW), was provided with propagation velocity V of from 8,000 to 12,000 (m/s), temperature coefficient for frequency TCF of from −15 to 15 (ppm/°C.) and effective coupling coefficient $K^2$ of from 0.3 to 0.8 (%). The SAW device is also provided with propagation loss of 0.05 (dB/λ) for 1st mode SAW, and 0.03 (dB/λ) for 2nd mode SAW. Further, such constitution has an advantage in fabricating process.

Further, in the "type C" SAW device according to the present invention, the further optimized dimensionless thickness $kh_z$ and $kh_s$ given in the region A-B-C-D-S-T-M-N-O-P-Q-R-A, shown in FIG. 1, for 2nd mode surface acoustic wave (SAW), achieved propagation velocity V of from 10,000 to 12,000 (m/s), temperature coefficient for frequency TCF of from −15 to 15 (ppm/°C.) and effective coupling coefficient $K^2$ of from 0.3 to 0.8 (%). The SAW device is also provided with propagation loss of 0.05 (dB/λ) for 1st mode SAW, and 0.03 (dB/λ) for 2nd mode SAW. Further, such constitution has an advantage in fabricating process.

Improvement in performances of type D SAW devices

In the "type D" SAW device according to the present invention, the device having ZnO and $SiO_2$ layers, that have the optimized dimensionless thickness $kh_z$ and $kh_s$ given in the region A-B-C-D-E-F-G-H-I-J-K-L-M-N-O-P-Q-R-A, shown in FIG. 1, for 2nd mode surface acoustic wave (SAW), was provided with propagation velocity V of from 8,000 to 12,000 (m/s), temperature coefficient for frequency TCF of from −15 to 15 (ppm/°C.) and effective coupling coefficient $K^2$ of from 0.6 to 1.8 (%). The SAW device is also provided with propagation loss of 0.05 (dB/λ) for 1st mode SAW, and 0.03 (dB/λ) for 2nd mode SAW. Further, such constitution has an advantage in fabricating process.

Further, in the "type D" SAW device according to the present invention, the further optimized dimensionless thickness $kh_z$ and $kh_s$ given in the region A-B-C-D-S-T-M-N-O-P-Q-R-A, shown in FIG. 1, for 2nd mode surface acoustic wave (SAW), achieved propagation velocity V of from 10,000 to 12,000 (m/s), temperature coefficient for frequency TCF of from −15 to 15 (ppm/°C.) and effective coupling coefficient $K^2$ of from 0.8 to 1.8 (%). The SAW device is also provided with propagation loss of 0.05 (dB/λ) for 1st mode SAW, and 0.03 (dB/λ) for 2nd mode SAW. Further, such constitution has an advantage in fabricating process.

Improvement in performances of type F SAW devices

In the "type F" SAW device according to the present invention, the device having ZnO and $SiO_2$ layers, that have the optimized dimensionless thickness $kh_z$ and $kh_s$ given in the region A-B-C-D-E-F-G-H-I-J-K-L-M-N-O-P-Q-R-A, shown in FIG. 1, for 2nd mode surface acoustic wave (SAW), was provided with propagation velocity V of from 8,000 to 12,000 (m/s), temperature coefficient for frequency TCF of from −15 to 15 (ppm/°C.) and effective coupling coefficient K of from 0.15 to 1.4 (%). The SAW device is also provided with propagation loss of 0.05 (dB/λ) for 1st mode SAW, and 0.03 (dB/λ) for 2nd mode SAW. Further, such constitution has an advantage in fabricating process.

Further, in the "type F" SAW device according to the present invention, the further optimized dimensionless thickness $kh_z$ and $kh_s$ given in the region A-B-C-D-S-T-M-N-O-P-Q-R-A, shown in FIG. 1, for 2nd mode surface acoustic wave (SAW), achieved propagation velocity V of from 10,000 to 12,000 (m/s), temperature coefficient for frequency TCF of from −15 to 15 (ppm/°C.) and effective coupling coefficient $K^2$ of from 0.4 to 1.4 (%). The SAW device is also provided with propagation loss of 0.05 (dB/λ) for 1st mode SAW, and 0.03 (dB/λ) for 2nd mode SAW. Further, such constitution has an advantage in fabricating process.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.7-202,114 (202,114/1995) filed on Aug. 8, 1995 is hereby incorporated by reference.

What is claimed is:

1. A surface acoustic wave device for 2nd mode surface acoustic wave of a wavelength λ (μm) comprising:
   (i) a diamond layer,
   (ii) a ZnO layer formed on said diamond layer, said ZnO layer having a thickness $t_z$,
   (iii) an interdigital transducer (IDT) formed on said ZnO layer, and
   (iv) a $SiO_2$ layer formed over said interdigital transducer onto said ZnO layer, said $SiO_2$ layer having a thickness of $t_s$;
   wherein a parameter $kh_z=(2\pi/\lambda)t_z$ and a parameter $kh_s=(2\pi/\lambda)t_s$ are given within a region A-B-C-D-E-F-G-H-I-J-K-L-M-N-O-P-Q-R-A in a two-dimensional Cartesian coordinate graph having abscissa axis of $kh_z$ and ordinate axis of $kh_s$,
   the outer edge of said region A-B-C-D-E-F-G-H-I-J-K-L-M-N-O-P-Q-R-A being given by a closed chain in said Cartesian coordinate consisting of points A, B, C, D, E, F, G, H, I, J, K, L, M, N, O, P, Q and R and lines A-B, B-C, C-D, D-E, E-F, F-G, G-H, H-I, I-J, J-K, K-L, L-M, M-N, N-O, O-P, P-Q, Q-R and R-A;
   said point A being given by a coordinate point ($kh_z=0.4$, $kh_s=0.55$);
   said point B being given by a coordinate point ($kh_z=0.6$, $kh_s=0.6$);
   said point C being given by a coordinate point ($kh_z=0.75$, $kh_s=0.63$);
   said point D being given by a coordinate point ($kh_z=0.88$, $kh_s=0.68$);
   said point E being given by a coordinate point ($kh_z=1.1$, $kh_s=0.8$);
   said point F being given by a coordinate point ($kh_z=1.3$, $kh_s=0.93$);
   said point G being given by a coordinate point ($kh_z=1.47$, $kh_s=1.03$);
   said point H being given by a coordinate point ($kh_z=1.61$, $kh_s=0.92$);
   said point I being given by a coordinate point ($kh_z=1.75$, $kh_s=0.77$);
   said point J being given by a coordinate point ($kh_z=1.82$, $kh_s=0.64$);
   said point K being given by a coordinate point ($kh_z=1.6$, $kh_s=0.54$);
   said point L being given by a coordinate point ($kh_z=1.41$, $kh_s=0.42$);
   said point M being given by a coordinate point ($kh_z=1.19$, $kh_s=0.35$);
   said point N being given by a coordinate point ($kh_z=1.03$, $kh_s=0.32$);
   said point O being given by a coordinate point ($kh_z=0.92$, $kh_s=0.28$);
   said point P being given by a coordinate point ($kh_z=0.8$, $kh_s=0.2$);
   said point Q being given by a coordinate point ($kh_z=0.66$, $kh_s=0.3$); and
   said point R being given by a coordinate point ($kh_z=0.53$, $kh_s=0.42$).

2. A surface acoustic wave device according to claim 1, wherein the parameter $kh_z$ and $kh_s$ are given within a region A-B-C-D-S-T-M-N-O-P-Q-R-A in said two-dimensional Cartesian coordinate graph,
   the outer edge of said region A-B-C-D-S-T-M-N-O-P-Q-R-A being given by a closed chain in said Cartesian coordinate, consisting of said points A, B, C and D, a point S, a point T, said points M, N, O, P, Q and R and lines A-B, B-C, C-D, D-S, S-T, T-M, M-N, N-O, O-P, P-Q, Q-R and R-A,
   said point S being given by a coordinate point ($kh_z=0.98$, $kh_s=0.6$); and
   said point T being given by a coordinate point ($kh_z=1.1$, $kh_s=0.5$).

3. A surface acoustic wave device for 2nd mode surface acoustic wave of a wavelength λ (μm) comprising:
   (i) a diamond layer,
   (ii) a short circuit electrode formed on said diamond layer,
   (iii) a ZnO layer formed over said short circuit electrode onto said diamond layer, said ZnO layer having a thickness $t_z$,
   (iv) an interdigital transducer (IDT) formed on said ZnO layer, and
   (v) a $SiO_2$ layer formed over said interdigital transducer onto said ZnO layer, said $SiO_2$ layer having a thickness of $t_s$;

wherein a parameter $kh_z=(2\pi/\lambda)t_z$ and a parameter $kh_s=(2\pi/\lambda)t_s$ are given within a region A-B-C-D-E-F-G-H-I-J-K-L-M-N-O-P-Q-R-A in a two-dimensional Cartesian coordinate graph having abscissa axis of $kh_z$ and ordinate axis of $kh_s$, the outer edge of said region A-B-C-D-E-F-G-H-I-J-K-L-M-N-O-P-Q-R-A being given by a closed chain in said Cartesian coordinate consisting of points A, B, C, D, E, F, G, H, I, J, K, L, M, N, O, P, Q and R and lines A-B, B-C, C-D, D-E, E-F, F-G, G-H, H-I, I-J, J-K, K-L, L-M, M-N, N-O, O-P, P-Q, Q-R and R-A, said point A being given by a coordinate point ($kh_z=0.4$, $kh_s=0.55$);

said point B being given by a coordinate point ($kh_z=0.6$, $kh_s=0.6$);

said point C being given by a coordinate point ($kh_z=0.75$, $kh_s=0.63$);

said point D being given by a coordinate point ($kh_z=0.88$, $kh_s=0.68$);

said point E being given by a coordinate point ($kh_z=1.1$, $kh_s=0.8$);

said point F being given by a coordinate point ($kh_z=1.3$, $kh_s=0.93$);

said point G being given by a coordinate point ($kh_z=1.47$, $kh_s=1.03$);

said point H being given by a coordinate point ($kh_z=1.61$, $kh_s=0.92$);

said point I being given by a coordinate point ($kh_z=1.75$, $kh_s=0.77$);

said point J being given by a coordinate point ($kh_z=1.82$, $kh_s=0.64$);

said point K being given by a coordinate point ($kh_z=1.6$, $kh_s=0.54$);

said point L being given by a coordinate point ($kh_z=1.41$, $kh_s=0.42$);

said point M being given by a coordinate point ($kh_z=1.19$, $kh_s=0.35$);

said point N being given by a coordinate point ($kh_z=1.03$, $kh_s=0.32$);

said point O being given by a coordinate point ($kh_z=0.92$, $kh_s=0.28$);

said point P being given by a coordinate point ($kh_z=0.8$, $kh_s=0.2$);

said point Q being given by a coordinate point ($kh_z=0.66$, $kh_s=0.3$); and said point R being given by a coordinate point ($kh_z=0.53$, $kh_s=0.42$).

4. A surface acoustic wave device according to claim 3, wherein the parameter $kh_z$ and $kh_s$ are given within a region A-B-C-D-S-T-M-N-O-P-Q-R-A in said two-dimensional Cartesian coordinate graph, the outer edge of said region A-B-C-D-S-T-M-N-O-P-Q-R-A being given by a closed chain in said Cartesian coordinate, consisting of said points A, B, C and D, a point S, a point T, said points M, N, O, P, Q and R and lines A-B, B-C, C-D, D-S, S-T, T-M, M-N, N-O, O-P, P-Q, Q-R and R-A, said point S being given by a coordinate point ($kh_z=0.98$, $kh_s=0.6$); and said point T being given by a coordinate point ($kh_z=1.1$, $kh_s=0.5$).

5. A surface acoustic wave device for 2nd mode surface acoustic wave of a wavelength $\lambda$ ($\mu$m) comprising:

(i) a diamond layer, (ii) a ZnO layer formed on said diamond layer, said ZnO layer having a thickness $t_z$, (iii) an interdigital transducer (IDT) formed on said ZnO layer, (iv) a SiO$_2$ layer formed over said interdigital transducer onto said ZnO layer, said SiO$_2$ layer having a thickness of $t_s$, and (v) a short circuit electrode formed on said SiO$_2$ layer;

wherein a parameter $kh_z=(2\pi/\lambda)t_z$ and a parameter $kh_s=(2\pi/\lambda)t_s$ are given within a region A-B-C-D-E-F-G-H-I-J-K-L-M-N-O-P-Q-R-A in a two-dimensional Cartesian coordinate graph having abscissa axis of $kh_z$ and ordinate axis of $kh_s$, the outer edge of said region A-B-C-D-E-F-G-H-I-J-K-L-M-N-O-P-Q-R-A being given by a closed chain in said Cartesian coordinate consisting of points A, B, C, D, E, F, G, H, I, J, K, L, M, N, O, P, Q and R and lines A-B, B-C, C-D, D-E, E-F, F-G, G-H, H-I, I-J, J-K, K-L, L-M, M-N, N-O, O-P, P-Q, Q-R and R-A, said point A being given by a coordinate point ($kh_z=0.4$, $kh_s=0.55$);

said point B being given by a coordinate point ($kh_z=0.6$, $kh_s=0.6$);

said point C being given by a coordinate point ($kh_z=0.75$, $kh_s=0.63$);

said point D being given by a coordinate point ($kh_z=0.88$, $kh_s=0.68$);

said point E being given by a coordinate point ($kh_z=1.1$, $kh_s=0.8$);

said point F being given by a coordinate point ($kh_z=1.3$, $kh_s=0.93$);

said point G being given by a coordinate point ($kh_z=1.47$, $kh_s=1.03$);

said point H being given by a coordinate point ($kh_z=1.61$, $kh_s=0.92$);

said point I being given by a coordinate point ($kh_z=1.75$, $kh_s=0.77$);

said point J being given by a coordinate point ($kh_z=1.82$, $kh_s=0.64$);

said point K being given by a coordinate point ($kh_z=1.6$, $kh_s=0.54$);

said point L being given by a coordinate point ($kh_z=1.41$, $kh_s=0.42$);

said point M being given by a coordinate point ($kh_z=1.19$, $kh_s=0.35$);

said point N being given by a coordinate point ($kh_z=1.03$, $kh_s=0.32$);

said point O being given by a coordinate point ($kh_z=0.92$, $kh_s=0.28$);

said point P being given by a coordinate point ($kh_z=0.8$, $kh_s=0.2$);

said point Q being given by a coordinate point ($kh_z=0.66$, $kh_s=0.3$); and said point R being given by a coordinate point ($kh_z=0.53$, $kh_s=0.42$).

6. A surface acoustic wave device according to claim 5, wherein the parameter $kh_z$ and $kh_s$ are given within a region A-B-C-D-S-T-M-N-O-P-Q-R-A in said two-dimensional Cartesian coordinate graph, the outer edge of said region A-B-C-D-S-T-M-N-O-P-Q-R-A being given by a closed chain in said Cartesian coordinate, consisting of said points A, B, C and D, a point S, a point T, said points M, N, O, P, Q and R and lines A-B, B-C, C-D, D-S, S-T, T-M, M-N, N-O, O-P, P-Q, Q-R and R-A, said point S being given by a coordinate point ($kh_z=0.98$, $kh_s=0.6$); and said point T being given by a coordinate point ($kh_z=1.1$, $kh_s=0.5$).

7. A surface acoustic wave device for 2nd mode surface acoustic wave of a wavelength λ (μm) comprising:

(i) a diamond layer, (ii) a short circuit electrode formed on said diamond layer, (iii) a ZnO layer formed over said short circuit electrode onto said diamond layer, said ZnO layer having a thickness $t_z$, (iv) an interdigital transducer (IDT) formed on said ZnO layer, (v) a SiO$_2$ layer formed over said interdigital transducer onto said ZnO layer, said SiO$_2$ layer having a thickness of $t_s$, and (vi) a short circuit electrode formed on said SiO$_2$ layer;

wherein a parameter $kh_z=(2\pi/\lambda)t_z$ and a parameter $kh_s=(2\pi/\lambda)t_s$ are given within a region A-B-C-D-E-F-G-H-I-J-K-L-M-N-O-P-Q-R-A in a two-dimensional Cartesian coordinate graph having abscissa axis of $kh_z$ and ordinate axis of $kh_s$, the outer edge of said region A-B-C-D-E-F-G-H-I-J-K-L-M-N-O-P-Q-R-A being given by a closed chain in said Cartesian coordinate consisting of points A, B, C, D, E, F, G, H, I, J, K, L, M, N, O, P, Q and R and lines A-B, B-C, C-D, D-E, E-F, F-G, G-H, H-I, I-J, J-K, K-L, L-M, M-N, N-O, O-P, P-Q, Q-R and R-A, said point A being given by a coordinate point ($kh_z=0.4$, $kh_s=0.55$);

said point B being given by a coordinate point ($kh_z=0.6$, $kh_s=0.6$);

said point C being given by a coordinate point ($kh_z=0.75$, $kh_s=0.63$);

said point D being given by a coordinate point ($kh_z=0.88$, $kh_s=0.68$);

said point E being given by a coordinate point ($kh_z=1.1$, $kh_s=0.8$);

said point F being given by a coordinate point ($kh_z=1.3$, $kh_s=0.93$);

said point G being given by a coordinate point ($kh_z=1.47$, $kh_s=1.03$);

said point H being given by a coordinate point ($kh_z=1.61$, $kh_s=0.92$);

said point I being given by a coordinate point ($kh_z=1.75$, $kh_s=0.77$);

said point J being given by a coordinate point ($kh_z=1.82$, $kh_s=0.64$);

said point K being given by a coordinate point ($kh_z=1.6$, $kh_s=0.54$);

said point L being given by a coordinate point ($kh_z=1.41$, $kh_s=0.42$);

said point M being given by a coordinate point ($kh_z=1.19$, $kh_s=0.35$);

said point N being given by a coordinate point ($kh_z=1.03$, $kh_s=0.32$);

said point O being given by a coordinate point ($kh_z=0.92$, $kh_s=0.28$);

said point P being given by a coordinate point ($kh_z=0.8$, $kh_s=0.2$);

said point Q being given by a coordinate point ($kh_z=0.66$, $kh_s=0.3$); and said point R being given by a coordinate point ($kh_z=0.53$, $kh_s=0.42$).

8. A surface acoustic wave device according to claim 7, wherein the parameter $kh_z$ and $kh_s$ are given within a region A-B-C-D-S-T-M-N-O-P-Q-R-A in said two-dimensional Cartesian coordinate graph, the outer edge of said region A-B-C-D-S-T-M-N-O-P-Q-R-A being given by a closed chain in said Cartesian coordinate, consisting of said points A, B, C and D, a point S, a point T, said points M, N, O, P, Q and R and lines A-B, B-C, C-D, D-S, S-T, T-M, M-N, N-O, O-P, P-Q, Q-R and R-A, said point S being given by a coordinate point ($kh_z=0.98$, $kh_s=0.6$); and said point T being given by a coordinate point ($kh_z=1.1$, $kh_s=0.5$).

9. A surface acoustic wave device for 2nd mode surface acoustic wave of a wavelength λ (μm) comprising:

(i) a diamond layer, (ii) an interdigital transducer (IDT) formed on said diamond layer, (iii) a ZnO layer formed over said interdigital transducer onto said diamond layer, said ZnO layer having a thickness $t_z$, (iv) a short circuit electrode formed on said ZnO layer, and (v) a SiO$_2$ layer formed over said short circuit electrode onto said ZnO layer, said SiO$_2$ layer having a thickness of $t_s$;

wherein a parameter $kh_z=(2\pi/\lambda)t_z$ and a parameter $kh_s=(2\pi/\lambda)t_s$ are given within a region A-B-C-D-E-F-G-H-I-J-K-L-M-N-O-P-Q-R-A in a two-dimensional Cartesian coordinate graph having abscissa axis of $kh_z$ and ordinate axis of $kh_s$, the outer edge of said region A-B-C-D-E-F-G-H-I-J-K-L-M-N-O-P-Q-R-A being given by a closed chain in said Cartesian coordinate consisting of points A, B, C, D, E, F, G, H, I, J, K, L, M, N, O, P, Q and R and lines A-B, B-C, C-D, D-E, E-F, F-G, G-H, H-I, I-J, J-K, K-L, L-M, M-N, N-O, O-P, P-Q, Q-R and R-A, said point A being given by a coordinate point ($kh_z=0.4$, $kh_s=0.55$);

said point B being given by a coordinate point ($kh_z=0.6$, $kh_s=0.6$);

said point C being given by a coordinate point ($kh_z=0.75$, $kh_s=0.63$);

said point D being given by a coordinate point ($kh_z=0.88$, $kh_s=0.68$);

said point E being given by a coordinate point ($kh_z=1.1$, $kh_s=0.8$);

said point F being given by a coordinate point ($kh_z=1.3$, $kh_s=0.93$);

said point G being given by a coordinate point ($kh_z=1.47$, $kh_s=1.03$);

said point H being given by a coordinate point ($kh_z=1.61$, $kh_s=0.92$);

said point I being given by a coordinate point ($kh_z=1.75$, $kh_s=0.77$);

said point J being given by a coordinate point ($kh_z=1.82$, $kh_s=0.64$);

said point K being given by a coordinate point ($kh_z=1.6$, $kh_s=0.54$);

said point L being given by a coordinate point ($kh_z=1.41$, $kh_s=0.42$);

said point M being given by a coordinate point ($kh_z=1.19$, $kh_s=0.35$);

said point N being given by a coordinate point ($kh_z=1.03$, $kh_s=0.32$);

said point O being given by a coordinate point ($kh_z=0.92$, $kh_s=0.28$);

said point P being given by a coordinate point ($kh_z=0.8$, $kh_s=0.2$);

said point Q being given by a coordinate point ($kh_z=0.66$, $kh_s=0.3$); and said point R being given by a coordinate point ($kh_z=0.53$, $kh_s=0.42$).

10. A surface acoustic wave device according to claim 9, wherein the parameter $kh_z$ and $kh_s$ are given within a region A-B-C-D-S-T-M-N-O-P-Q-R-A in said two-dimensional Cartesian coordinate graph, the outer edge of said region A-B-C-D-S-T-M-N-O-P-Q-R-A being given by a closed chain in said Cartesian coordinate, consisting of said points A, B, C and D, a point S, a point T, said points M, N, O, P, Q and R and lines A-B, B-C, C-D, D-S, S-T, T-M, M-N, N-O, O-P, P-Q, Q-R and R-A, said point S being given by a coordinate point ($kh_z=0.98$, $kh_s=0.6$); and said point T being given by a coordinate point ($kh_z=1.1$, $kh_s=0.5$).

* * * * *